US010171082B2

(12) United States Patent
Akahane (10) Patent No.: US 10,171,082 B2
(45) Date of Patent: Jan. 1, 2019

(54) DRIVING CIRCUIT

(71) Applicant: FUJI ELECTRIC CO., LTD., Kanagawa (JP)

(72) Inventor: Masashi Akahane, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 1 day.

(21) Appl. No.: 15/475,140

(22) Filed: Mar. 31, 2017

(65) Prior Publication Data

US 2017/0207785 A1 Jul. 20, 2017

Related U.S. Application Data

(63) Continuation of application No. PCT/JP2016/053238, filed on Feb. 3, 2016.

(30) Foreign Application Priority Data

Apr. 9, 2015 (JP) ................................. 2015-079750

(51) Int. Cl.
*H03K 3/00* (2006.01)
*H03K 19/0185* (2006.01)
(Continued)

(52) U.S. Cl.
CPC ......... *H03K 19/0185* (2013.01); *H03K 3/037* (2013.01); *H03K 17/16* (2013.01); *H03K 17/162* (2013.01); *H03K 17/687* (2013.01); *H03K 19/0175* (2013.01); *H03K 19/018507* (2013.01); *H03K 2217/0063* (2013.01)

(58) Field of Classification Search
None
See application file for complete search history.

(56) References Cited

U.S. PATENT DOCUMENTS

2003/0016054 A1* 1/2003 Okamoto ............. H03K 17/063
326/80
2009/0243697 A1 10/2009 Funakoshi eet al.
(Continued)

FOREIGN PATENT DOCUMENTS

JP H9-172366 A 6/1997

OTHER PUBLICATIONS

International Search Report for International Patent Application No. PCT/JP2016/053238, issued by the Japan Patent Office dated Mar. 1, 2016.
(Continued)

*Primary Examiner* — Long Nguyen (57) ABSTRACT

A malfunction is prevented in a driving circuit. A driving circuit in which each of the set side level shift circuit and the reset side level shift circuit has an input transistor, a serial transistor unit which includes a first MOS transistor and a second MOS transistor which are connected in series, the first MOS transistors complementarily operate to each other, the driving circuit further has a set side buffer which compares a level of the set potential with a threshold value depending on the reference potential, and controls the reset side second MOS transistor, and a reset side buffer which compares a level of the reset potential with a threshold value depending on the reference potential, and controls the set side second MOS transistor.

13 Claims, 7 Drawing Sheets

(51) Int. Cl.
*H03K 17/16* (2006.01)
*H03K 17/687* (2006.01)
*H03K 19/0175* (2006.01)
*H03K 3/037* (2006.01)

(56) References Cited

U.S. PATENT DOCUMENTS

| | | | |
|---|---|---|---|
| 2011/0043269 A1 | 2/2011 | Nishijima et al. | |
| 2011/0134710 A1* | 6/2011 | Akahane ........ | H03K 19/018521 |
| | | | 365/189.11 |
| 2012/0081149 A1 | 4/2012 | Akahane et al. | |
| 2013/0278319 A1* | 10/2013 | Akahane .......... | H03K 3/356182 |
| | | | 327/333 |
| 2014/0292392 A1* | 10/2014 | Akahane .......... | H03K 17/04123 |
| | | | 327/333 |
| 2016/0197614 A1* | 7/2016 | Akahane .......... | H03K 17/04123 |
| | | | 327/109 |

OTHER PUBLICATIONS

Extended European Search Report for European Patent Application No. 16776311.9, issued by the European Patent Office dated Oct. 10, 2017.

* cited by examiner

DRIVING CIRCUIT

The contents of the following Japanese patent applications are incorporated herein by reference:
NO. 2015-079750 filed in JP on Apr. 9, 2015, and
NO. PCT/JP2016/053238 filed on Feb. 3, 2016.

BACKGROUND

1. Technical Field

The present invention relates to a driving circuit.

Conventionally, a driving circuit which drives a subsequent stage circuit such as a switch element is known (for instance, refer to Patent Document 1). The driving circuit outputs a control signal of a logical value depending on an input signal, and drives a subsequent stage circuit. The driving circuit has a level shift circuit which shifts a level of an input signal from a preceding stage circuit which operates at low voltage, and a control circuit which generates a control signal depending on an output of the level shift circuit.

PRIOR ART DOCUMENT

Patent Document

Patent Document 1: Japanese Patent Application Publication No. 2011-139423

A surge voltage is sometimes generated in the driving circuit. For instance, when a subsequent stage switch element is switched, a large surge voltage is sometimes generated. A drawback that when a surge voltage is transmitted to the level shift circuit side, a signal depending on the surge voltage is inputted to the control circuit, and the control circuit outputs a control signal of an erroneous logical value is known.

SUMMARY

In an aspect of the present invention, the driving circuit which drives a subsequent stage circuit depending on a set signal and a reset signal that are inputted may comprise a set side level shift circuit, a reset side level shift circuit, and a control circuit. The set side level shift circuit may operate depending on the set signal, and generate a set potential. The reset side level shift circuit may operate depending on the reset signal, and generate a reset potential. The control circuit may generate a control signal depending on the set potential and the reset potential, and drive the subsequent stage circuit. Each of the set side level shift circuit and the reset side level shift circuit may have an input transistor and a serial transistor unit. The input transistor may be provided between a high potential and a reference potential. The input transistor may operate depending on the set signal or the reset signal, and output a drain voltage as the set potential or the reset potential. The serial transistor unit may include a first MOS transistor and a second MOS transistor. The first MOS transistor and the second MOS transistor may be connected in series between a drain terminal of the input transistor and the high potential. The first MOS transistors in the set side level shift circuit and the reset side level shift circuit may complementarily operate to each other corresponding to a logical value of the control signal which the control circuit outputs. The set side level shift circuit may further have a set side buffer. The set side buffer may compare a level of the set potential with a threshold value depending on the reference potential, and control the second MOS transistor of the reset side level shift circuit based on a result of the comparison. The reset side level shift circuit may further have a reset side buffer. The reset side buffer may compare a level of the reset potential with a threshold value depending on the reference potential, and control the second MOS transistor of the set side level shift circuit based on a result of the comparison.

When a negative surge voltage is applied to the reference potential, the set side buffer and the reset side buffer may control the corresponding second MOS transistors to OFF states. When a positive surge voltage is applied to the reference potential, the set side buffer and the reset side buffer may control the corresponding second MOS transistors to ON states.

The set side buffer may maintain the corresponding second MOS transistor to an ON state during a longer period than a pulse width of the set potential. The reset side buffer may maintain the corresponding second MOS transistor to an ON state during a longer period than a pulse width of the reset potential. A maintaining period in which the set side buffer keeps maintaining the second MOS transistor to an ON state after a pulse of the set potential is finished and a maintaining period in which the reset side buffer keeps maintaining the second MOS transistor to an ON state after a pulse of the reset potential is finished may be equal.

Maintaining periods in the set side buffer and the reset side buffer may be variable. Each of the set side level shift circuit and the reset side level shift circuit may further have a resistance provided parallel to the serial transistor unit between the high potential and the reference potential.

Properties of the respective first MOS transistors in the set side level shift circuit and the reset side level shift circuit may be equal. Properties of the respective second MOS transistors in the set side level shift circuit and the reset side level shift circuit may be equal. Each of the set side buffer and the reset side buffer may have a MOS transistor, a resistance, and an output unit. A source of the MOS transistor may be connected to the high potential. The resistance may be connected to a drain of the MOS transistor. The output unit may operate depending on a drain voltage of the MOS transistor.

The output unit may have an inverter which operates depending on a drain voltage of the MOS transistor. The control circuit may have a latch circuit and a driver unit. The latch circuit may output a control signal depending on the set potential and the reset potential which are inputted. The driver unit may drive a subsequent stage circuit depending on the control signal. The driving circuit may further comprise a feedback unit. The feedback unit may make first MOS transistors of the set side level shift circuit and the reset side level shift circuit complementarily operate based on the control signal. The feedback unit may control the first MOS transistor of the set side level shift circuit to an ON state when the control signal is an L logic. The feedback unit may control the first MOS transistor of the reset side level shift circuit to an OFF state when the control signal is an H logic. The subsequent stage circuit may be made of a circuit in which two transistors are connected in series. The reference potential may be a potential of a connection point of the two transistors.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments do not limit the invention according to the scope of claim. Also, all the combinations of the features described in the embodiments are not necessarily essential to means provided by aspects of the invention.

Figure 1:
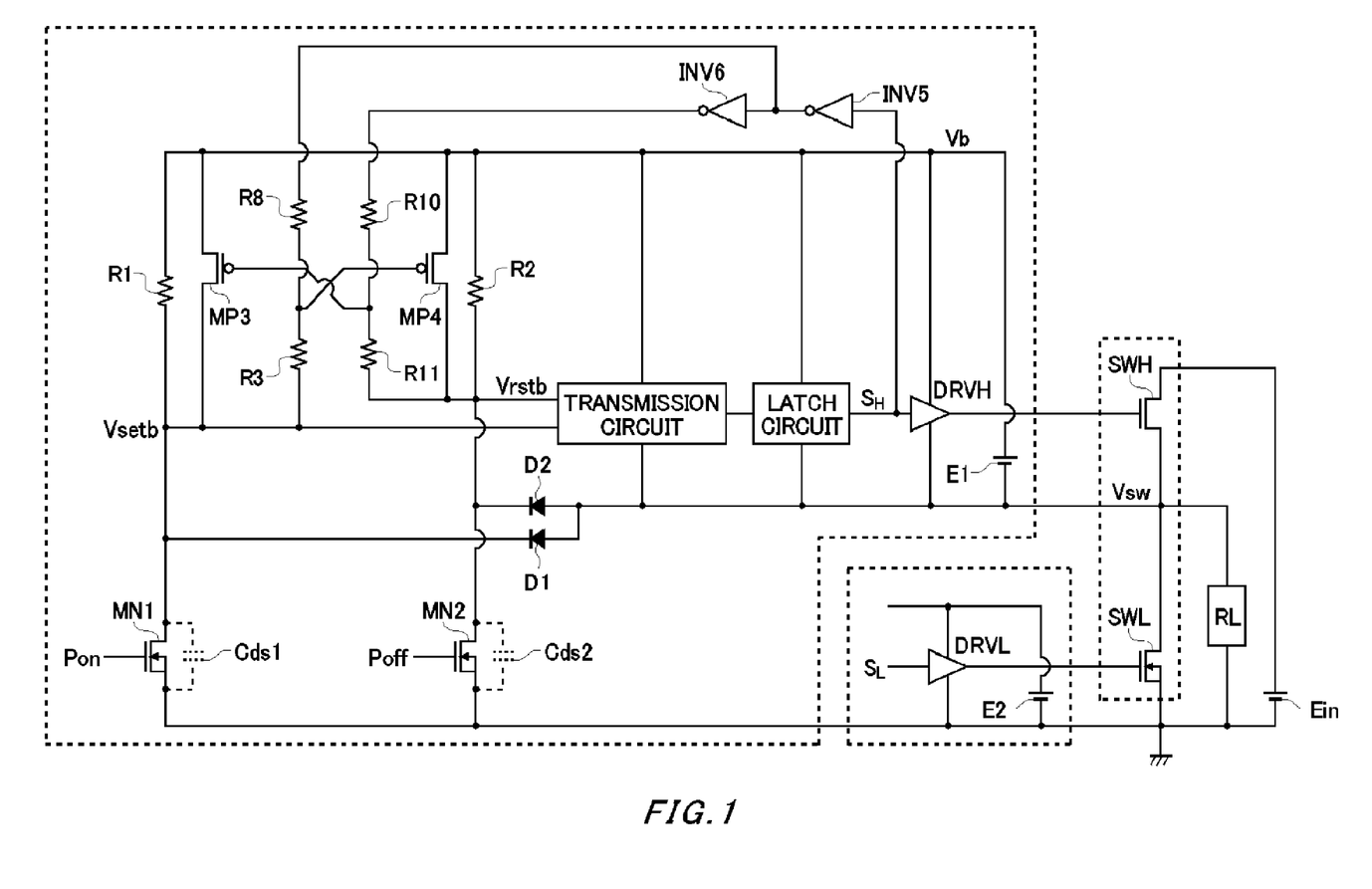
FIG. 1 is a diagram showing a driving circuit as a reference example.

[Reference Example] FIG. 1 is a diagram showing a driving circuit as a reference example. The driving circuit shown in FIG. 1 is equivalent to the circuit disclosed in FIG. 15 of the Patent Document 1. The driving circuit operates depending on input signals Pon and Poff which are inputted from the preceding stage circuit which operates at low voltage, and generates a control signal which controls an operation of a switch element SWH.

A transistor MN1 operates depending on the input signal Pon. The input signal Pon is a signal which shows an H logic when a high-side switch element SWH should be set to the ON state. When the input signal Pon is an H logic, the transistor MN1 is an ON state. In this case, a set potential Vsetb is clamped to a Vsw potential which is on the low potential side of a power source E1 by a diode D1. Also, when the transistor MN1 is in an OFF state, the set potential Vsetb is almost equal to a high potential Vb which is on the high potential side of a power source E1.

A transistor MN2 operates depending on the input signal Poff. The input signal Poff is a signal which is brought into an H logic when a high-side switch element SWH should be set to the OFF state. When the input signal Poff is an H logic, the transistor MN2 is in the ON state. In this case, a reset potential Vrstb is clamped to a Vsw potential by a diode D2. Also, when the transistor MN2 is in the OFF state, the reset potential Vrstb is almost equal to a predetermined high potential Vb. By such operations, levels of the low voltage input signals Pon and Poff are shifted.

A transmission circuit controls a subsequent stage latch circuit, based on the set potential Vsetb and the reset potential Vrstb. For instance, when the set potential Vsetb is an L level and the reset potential Vrstb is an H level, the transmission circuit sets an output of the latch circuit to a predetermined high potential. Also, when the set potential Vsetb is the H level and the reset potential Vrstb is the L level, the transmission circuit resets the output of the latch circuit to a predetermined low potential. When the set potential Vsetb and the reset potential Vrstb are both the H levels, or are both the L levels, the transmission circuit maintains the output of the latch circuit.

A high-side driver unit DRVH inputs a control signal depending on the output of the latch circuit to a gate terminal of a high-side switch element SWH. Thereby, the switch element SWH can be controlled depending on the input signals Pon and Poff. Note that a low-side driver unit DRVL operates at the same potential system as a circuit which generates the input signals Pon and Poff. For this reason, a low-side driving circuit does not have a level shift function.

Also, the driving circuit comprises inverters INV5 to INV6, resistances R8 to R11 and transistors MP3 to MP4 in order to prevent a malfunction due to so-called dV/dt noise. The transistors MP3 and MP4 are both P-channel MOS transistors. The inverters INV5 to INV6 output any of a high potential Vb or a high-side reference potential Vsw depending on an inputted signal.

When a latch circuit outputs an H logic signal SH, the inverter INV5 outputs the reference potential Vsw, and the inverter INV6 outputs the high potential Vb. In this case, a potential obtained by dividing difference of the high potential Vb and the reference potential Vsw by a resistance R8, a resistance R9 and a resistance R1 is applied to a gate of a reset side transistor MP4. Also, because the high potential Vb is applied to both ends of resistances R10, R11 and R2 which are connected in series, a potential of a connection point of resistances R10 and R11 is also a high potential Vb. Accordingly, the high potential Vb is applied to a gate of a set side transistor MP3.

That is, when the latch circuit outputs an H logic signal SH, a gate voltage of the reset side transistor MP4 is lower than a gate voltage of the set side transistor MP3. Accordingly, the transistor MP3 is the OFF state, while the transistor MP4 is the state near the ON state. That is, an impedance of the transistor MP4 is lower than an impedance of the transistor MP3.

A case in which a dV/dt noise is generated in the reference potential Vsw in such state is examined. When switch elements SWH and SWL are switched, the high-side reference potential Vsw varies in a range of an extremely large high voltage Ein. Because a high-side high potential Vb is a potential in which a constant voltage E1 is added to the reference potential Vsw, for instance, when the reference potential Vsw rises, the high potential Vb also rises similarly.

That is, a potential Vb of a series circuit of the resistance R1 and the transistor MN1, and a series circuit of a resistance R2 and the transistor MN2 is increased. On the other hand, parasitic capacitances Cds1, Cds2 are present between sources and drains of the transistors MN1 and MN2. For this reason, if a change of the high potential Vb is sharp, by a charging/discharging operation toward parasitic capacitances Cds1, Cds2, the set potential Vsetb and the reset potential Vrstb cannot be tracked.

The transmission circuit uses a power source E1 which is connected between the high potential Vb and the reference potential Vsw as a power source. The transmission circuit detects logical values of the set potential Vsetb and the reset potential Vrstb by comparing the set potential Vsetb and the reset potential Vrstb with threshold values depending on these potentials. For this reason, if the set potential Vsetb and the reset potential Vrstb vary contrary to each other by the dV/dt noise, there is a possibility of a malfunction.

On the other hand, the driving circuit of FIG. 1 gives difference to impedances of the set side transistor MP3 and the reset side transistor MP4 depending on the output of the latch circuit. For this reason, even when the set potential Vsetb and the reset potential Vrstb vary due to the dV/dt noise, ways of varying of the set potential Vsetb and the reset potential Vrstb can be given difference depending on the output of the latch circuit.

That is, even when the set potential Vsetb and the reset potential Vrstb vary due to the dV/dt noise, impedances of the set side transistor MP3 and the reset side transistor MP4 are given difference so that the size relation the set potential Vsetb and the reset potential Vrstb should have originally can be maintained. By such configuration, the driving circuit shown in FIG. 1 prevents a malfunction due to the dV/dt noise. However, there is room for malfunction left depending on the surge voltage applied to the reference potential Vsw.

Figure 2:
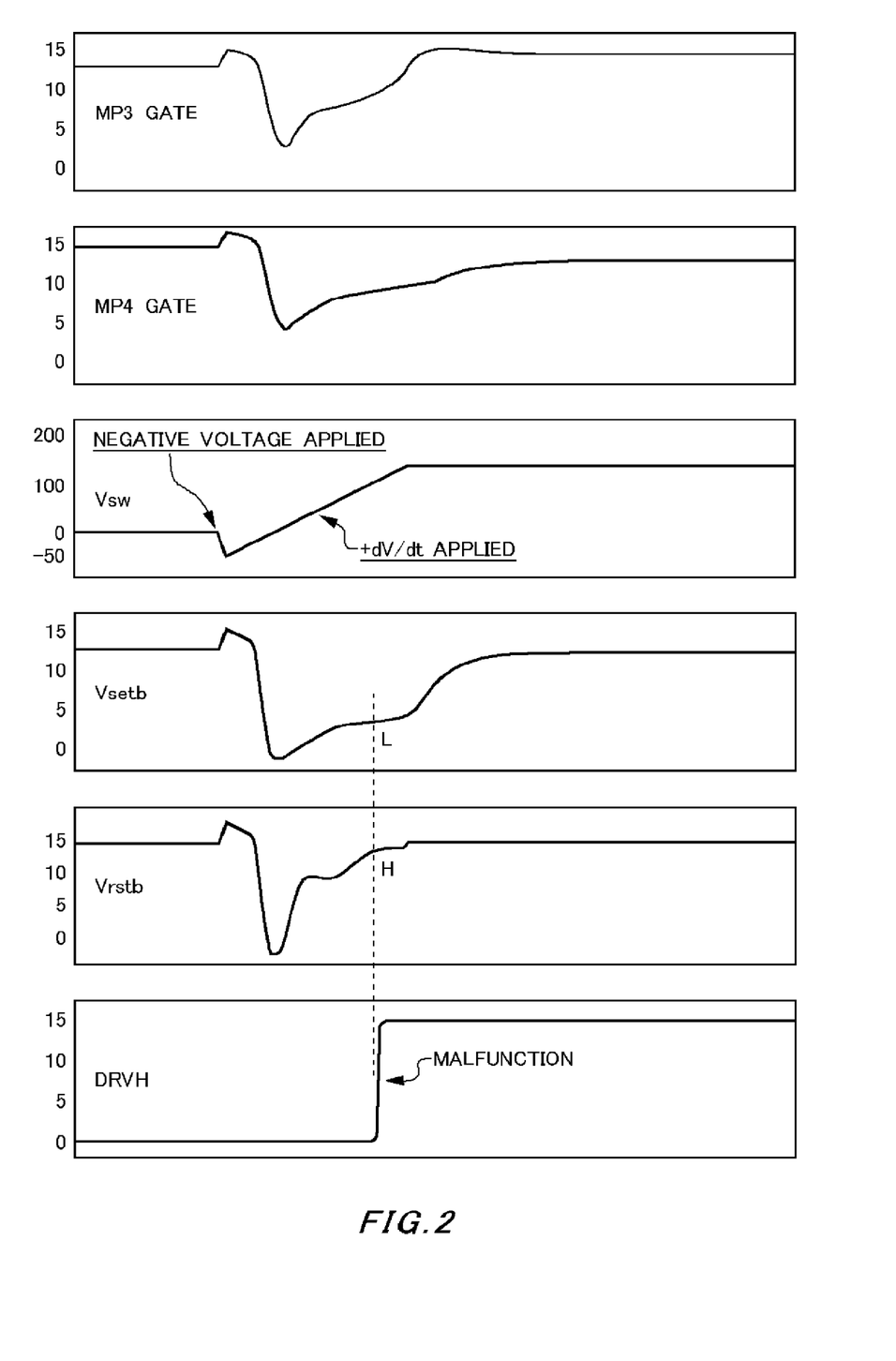
FIG. 2 is a diagram showing an operation example of the driving circuit shown in FIG. 1.

FIG. 2 is a diagram showing an operation example of the driving circuit shown in FIG. 1. In FIG. 2, time waveforms are shown regarding a gate voltage of the transistor MP3, a gate voltage of the transistor MP4, a reference potential Vsw, a set potential Vsetb, a reset potential Vrstb, and an output voltage of a driver circuit DRVH. In FIG. 2, the vertical axis shows a voltage [V]. Note that voltages other than the reference potential Vsw show voltage values with respect to the reference potential Vsw. That is, 0V of the vertical axis in voltage waveforms other than the reference potential Vsw correspond to the reference potential Vsw.

In the example of FIG. 2, the case in which a surge voltage is applied to the reference potential Vsw in the state that a driver circuit DRVH outputs an L logic control signal is shown. In the present example, after a predetermined negative voltage is applied to the reference potential Vsw, a dV/dt noise is applied. The surge voltage is sometimes generated from operations of the switch elements SWH and SWL, and also is sometimes applied from the outside. Depending on the applied negative voltage, the high-side reference potential Vsw and the high potential Vb sometimes fall below the low-side reference potential (the ground potential in the present example).

When the negative voltage is applied to the reference potential Vsw, a forward current flows to parasitic diodes not illustrated which are included in transistors MP3, MP4, and potentials of drain terminals of the transistors MN1 and MN2 are temporarily higher potentials than the reference potential Vsw and the high potential Vb. That is, the set potential Vsetb and the reset potential Vrstb are temporarily higher potentials than the reference potential Vsw and the high potential Vb.

If the set potential Vsetb and the reset potential Vrstb are high, a discharge current flows from parasitic capacitances Cds1 and Cds2 of the transistors MN1 and MN2. Note that even though impedances of the transistors MP3 and MP4 are given difference depending on the output state of the latch circuit, there is a small difference of a discharge current which flows to the set side and the reset side due to a forward current of parasitic diodes of the transistors MP3, MP4.

After the discharge current is flown, if a dV/dt noise of a positive voltage is applied, parasitic capacitances Cds1 and Cds2 and other parasitic capacitances are charged. However, due to variations of a layout and the like, a set side parasitic capacitance and a reset side parasitic capacitance have a difference, and, in an applied state of a negative voltage, a difference of impedances of the transistors MP3, MP4 is small due to a forward bias of parasitic diodes. For this reason, a difference is generated in a charging time of a parasitic capacitance between the set side and the reset side, and a difference is generated in ways of varying with respect to the dV/dt noise between the set potential Vsetb and the reset potential Vrstb. Thereby, logical values of the set potential Vsetb and the reset potential Vrstb are sometimes different from the values to have originally.

For instance, in the example shown in FIG. 2, the driver unit DRVH outputs the L logic. In this case, when the set potential Vsetb and the reset potential Vrstb are both H logics or both L logics, because the output of the driver unit DRVH is maintained, a malfunction does not occur. Also, when the set potential Vsetb is the H logic, and the reset potential Vrstb is the L logic, because the output of the driver unit DRVH is reset to the L logic, a malfunction does not occur.

On the other hand, due to a positive dV/dt noise after applying a negative voltage, the set potential Vsetb is the L logic and the reset potential Vrstb is the H logic, the output of the driver unit DRVH is set to the H logic, so a malfunction occurs. By providing transistors MP3 and MP4 and the like, a malfunction of the driver unit DRVH can be decreased, but depending on a condition such as the surge voltage to which a positive dV/dt is applied after application of a negative voltage, there is room that a malfunction occurs.

Figure 3:
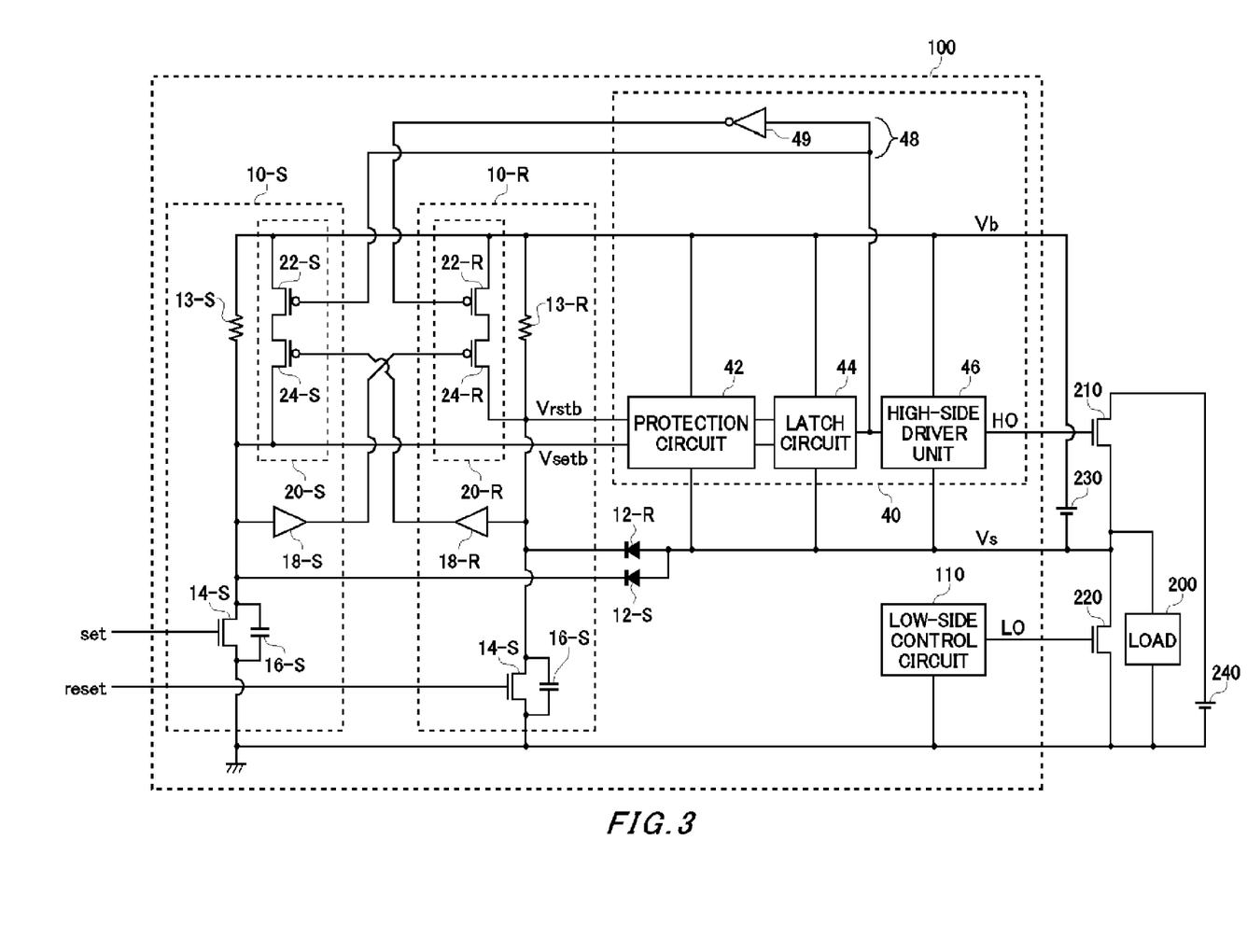
FIG. 3 is a diagram showing one example of the driving circuit 100 according to an embodiment of the present invention.

[Embodiment] FIG. 3 is a diagram showing one example of the driving circuit 100 according to an embodiment of the present invention. The driving circuit 100 drives a subsequent stage circuit depending on an inputted set signal SET and reset signal RESET. The subsequent stage circuit is, for instance, a circuit in which two transistors 210 and 220 are connected in series, and switch whether to connect one end of a load 200 to a high voltage power source 240, or connect to a common reference potential such as a ground potential.

The transistor 210 and the transistor 220 are, for instance, serially connected IGBTs or high-pressure MOSFETs or the like. A source terminal and a drain terminal of the high-side n-type transistor 210 are connected to the low-side n-type transistor 220 and a high voltage power source 240. A source terminal and a drain terminal of the low-side transistor 220 are connected to a ground potential and the high-side transistor 210. Also, a load 200 is connected to connection nodes of the transistor 210 and the transistor 220.

By controlling the high-side transistor 210 to the ON state, and controlling the low-side transistor 220 to the OFF state, the high voltage power source 240 is connected to the load 200. Also, by controlling the high-side transistor 210 to the OFF state, and controlling the low-side transistor 220 to the ON state, the common reference potential is connected to the load 200.

The driving circuit 100 comprises a set side level shift circuit 10-S, a reset side level shift circuit 10-R, a high-side control circuit 40, a low-side control circuit 110, a set side diode 12-S, and a reset side diode 12-R. Also, the driving circuit 100 is connected to the high-side power source 230 which generates a high potential Vb with the high-side reference potential Vs as a reference. Also, the high-side power source 230 may also be provided inside the driving circuit 100. A power source voltage of the high-side power source 230 may be 15V. Also, a high-side reference potential Vs is a potential of a connection point of the transistor 210 and the transistor 220.

The high-side control circuit 40 operates using the high-side power source 230 which is connected between the high-side reference potential Vs and the high potential Vb as a power source. The high-side control circuit 40 controls the transistor 210 by selectively applying the high potential Vb, the high-side reference potential Vs, or a predetermined intermediate potential between the high potential Vb and the high-side reference potential Vs to a gate terminal of the transistor 210.

The low-side control circuit 110 operates at a power source (not illustrated) which uses a low-side common reference potential (for instance, a ground potential) as a reference. In the present example, a power source voltage of this power source is 15V.

The set side level shift circuit 10-S operates depending on a set signal SET, and generates a set potential Vsetb to be inputted to the high-side control circuit 40. The set side level shift circuit 10-S generates a set potential Vsetb in which a level of the set signal SET is shifted to a level depending on a high-side potential system.

The set side level shift circuit 10-S of the present example has a resistance 13-S, an input transistor 14-S, a set side buffer 18-S, and a serial transistor unit 20-S. Also, a parasitic capacitance 16-S is present between a source and a drain of the input transistor 14-S.

The input transistor 14-S is provided between a high-side high potential Vb and a common reference potential GND, operates depending on a set signal SET, and outputs a drain potential as the set potential Vsetb. The input transistor 14-S of the present example is a NMOS transistor.

The set signal SET has a positive pulse at a timing of setting an output of a below-described latch circuit 44 to a high potential Vb. The input transistor 14-S is controlled to the ON state when the set signal SET shows the H logic, and outputs a high-side reference potential Vs as a set potential Vsetb due to a clamp of a diode 12-S. Also, the input transistor 14-S is controlled to the OFF state when the set signal SET shows the L logic, and outputs a high potential Vb as a set potential Vsetb.

The reset side level shift circuit 10-R operates depending on a reset signal RESET, and generates a reset potential Vrstb to be inputted to the high-side control circuit 40. The reset side level shift circuit 10-R generates a reset potential Vrstb in which a level of the reset signal RESET is shifted to the level depending on the high-side potential system.

The reset side level shift circuit 10-R of the present example has a resistance 13-R, an input transistor 14-R, a reset side buffer 18-R, and a serial transistor unit 20-R. Also, a parasitic capacitance 16-R is present between a source and a drain of the input transistor 14-R.

The input transistor 14-R is provided between a high-side high potential Vb and a common reference potential GND, operates depending on a reset signal RESET, and outputs a drain potential as the reset potential Vrstb. The input transistor 14-R of the present example is a NMOS transistor.

The reset signal RESET has a positive pulse at a timing of resetting an output of a below-described latch circuit 44 to a high-side reference potential Vs. The input transistor 14-R is controlled to the ON state when the reset signal RESET shows the H logic, and outputs a high-side reference potential Vs as the reset potential Vrstb due to a clamp of a diode 12-R. Also, the input transistor 14-R is controlled to the OFF state when the reset signal RESET shows the L logic, and outputs a high potential Vb as a reset potential Vrstb.

The high-side control circuit 40 generates a control signal HO which controls the transistor 210, based on the set potential Vsetb and the reset potential Vrstb. The high-side control circuit 40 of the present example has a protection circuit 42, a latch circuit 44, a high-side driver unit 46, and a feedback unit 48.

The protection circuit 42 generates a signal which controls the latch circuit 44, based on the set potential Vsetb and the reset potential Vrstb. The protection circuit 42 compares each of the set potential Vsetb and the reset potential Vrstb with a predetermined threshold value potential, and detects respective logical values. For instance, the threshold value potential is an intermediate potential of the high potential Vb and the high-side reference potential Vs.

The protection circuit 42 controls the latch circuit 44 depending on a combination of logical values of the set potential Vsetb and the reset potential Vrstb. The protection circuit 42 of the present example maintains the output of the latch circuit 44 when logical values of the set potential Vsetb and the reset potential Vrstb are the same (that is, both the H logic, or both the L logic). Also, the protection circuit 42 sets the output of the latch circuit 44 to the high potential Vb when the set potential Vsetb is the L logic, and the reset potential Vrstb is the H logic. Also, the protection circuit 42 resets the output of the latch circuit 44 to the high-side reference potential Vs when the set potential Vsetb is the H logic, and the reset potential Vrstb is the L logic.

The latch circuit 44 outputs a potential depending on a signal from the protection circuit 42. The high-side driver unit 46 outputs a control signal HO which shows any of the high potential Vb and the high-side reference potential Vs depending on the potential which the latch circuit 44 outputs. The high-side driver unit 46 inputs the control signal HO to a gate terminal of the transistor 210. By such operations, the driving circuit 100 generates a control signal HO in which levels of an inputted set signal SET and reset signal RESET are shifted, and controls the transistor 210.

Note that an anode terminal of the set side diode 12-S is connected to a high-side reference potential Vs, and a cathode terminal of the set side diode 12-S is connected to a drain terminal of the input transistor 14-S. Thereby, the set side diode 12-S clamps the set potential Vsetb using the high-side reference potential Vs as a reference.

Also, an anode terminal of the reset side diode 12-R is connected to the high-side reference potential Vs, and a cathode terminal of the reset side diode 12-R is connected to a drain terminal of the input transistor 14-R. Thereby, the reset side diode 12-R clamps the reset potential Vrstb using the high-side reference potential Vs as a reference.

Note that the driving circuit 100 has a feedback unit 48, serial transistor units 20-S, 20-R, a set side buffer 18-S, and a reset side buffer 18-R so as to prevent a malfunction due to a dV/dt noise and the like. The feedback unit 48 feedbacks a potential depending on an output potential of the latch circuit 44 to serial transistor units 20 of respective level shift circuits 10.

The feedback unit 48 of the present example makes a serial transistor unit 20-S to propagate an output potential of the latch circuit 44, and makes a serial transistor unit 20-R to propagate an inverted potential of an output potential of the latch circuit 44. Note that the inverted potential of the output potential is the high-side reference potential Vs when the output potential is the high potential Vb, and is the high potential Vb when the output potential is the high-side reference potential Vs. The feedback unit 48 has an inverter 49 which inverts the output potential of the latch circuit 44.

The respective serial transistor units 20 have a first MOS transistor 22 and a second MOS transistor 24. The first MOS transistor 22 and the second MOS transistor 24 are connected in series between a drain terminal of the input transistor 14 and a high potential Vb. In the present example, the first MOS transistor 22 and the second MOS transistor 24 are PMOS transistors. Either of the first MOS transistor 22 and the second MOS transistor 24 may be connected to the high potential Vb side.

Two first MOS transistors 22 in a set side level shift circuit 10-S and a reset side level shift circuit 10-R complementarily operate to each other corresponding to a logical value of a control signal HO which the high-side control circuit 40 outputs (in the present example, the same as to a logical value of a potential which the latch circuit 44 outputs). In the present example, the output potential of the latch circuit 44 is applied to a gate terminal of the set side first MOS transistor 22-S. Also, the output potential of the inverter 49 which is obtained by inverting the output potential of the latch circuit 44 is applied to a gate terminal of the reset side first MOS transistor 22-R.

Also, the set side buffer 18-S compares a level of a set potential Vsetb with a threshold value, and controls the reset side second MOS transistor 24-R based on the result of the comparison. The threshold value is determined by the high potential Vb. The set side buffer 18-S outputs the high potential Vb when the set potential Vsetb is larger than or equal to the threshold value, and outputs the high-side reference potential Vs when the set potential Vsetb is smaller than the threshold value. The output of the set side buffer 18-S is applied to an gate terminal of the reset side second MOS transistor 24-R.

The reset side buffer 18-R compares a level of a reset potential Vrstb with a threshold value, and controls a set side second mos transistor 24-S based on the result of the comparison. The threshold value is the same as the threshold value in the set side buffer 18-S. The reset side buffer 18-R outputs the high potential Vb when the reset potential Vrstb is larger than or equal to the threshold value, and outputs the high-side reference potential Vs when the reset potential Vrstb is smaller than the threshold value. The output of the reset side buffer 18-R is applied to an gate terminal of the set side second MOS transistor 24-S.

When the second MOS transistor 24 is the ON state, the potential which corresponds to the serial transistor unit 20 in which the first MOS transistor 22 is controlled to the ON state among the set potential Vsetb and the reset potential Vrstb is connected to the high potential Vb. For instance, when the latch circuit 44 outputs the L logic, because the set side first MOS transistor 22-S is the ON state, the set potential Vsetb is connected to the high potential Vb.

On the other hand, because the reset side first MOS transistor 22-R is the OFF state, a series resistance value between the first MOS transistor 22-R and the second MOS transistor 24-R (between Vb and Vrstb) has high resistance. For this reason, the reset potential Vrstb is equivalent to the potential which is connected to the high potential Vb via the resistance 13-R which is connected in parallel. Note that a resistance value of the resistance 13-R (similar to the a resistance 13-S) is larger than a combined resistance of each ON resistance of the first MOS transistor 22 and the second MOS transistor 24, and is smaller than a combined resistance of each resistance when either or both is(are) the OFF state(s). For this reason, the set potential Vsetb becomes the high potential Vb earlier than the reset potential Vrstb. Accordingly, it is prevented that the set potential Vsetb is the L logic and the reset potential Vrstb is the H logic, which can prevent a malfunction of the high-side control circuit 40.

Note that when the set potential Vsetb is the high potential Vb and an output of the set side buffer 18-S is the high potential Vb, the second MOS transistor 24-R is controlled to the OFF state. However, when the second MOS transistor 24-R is the OFF state while the dV/dt noise is being applied, there is a possibility of a malfunction of the high-side control circuit 40. This is similar as regarding the second MOS transistor 24-S.

For this reason, respective buffers 18 preferably maintain the respective second MOS transistors 24 to the ON states while the dV/dt noise is being applied. The respective buffers 18 of the present example maintain the second MOS transistors 24 to the ON states until a predetermined period has passed after the size relation of a potential of an input terminal and a threshold value is reversed, even when the size relation is reversed after the second MOS transistors 24 are controlled to the ON states.

Figure 4:
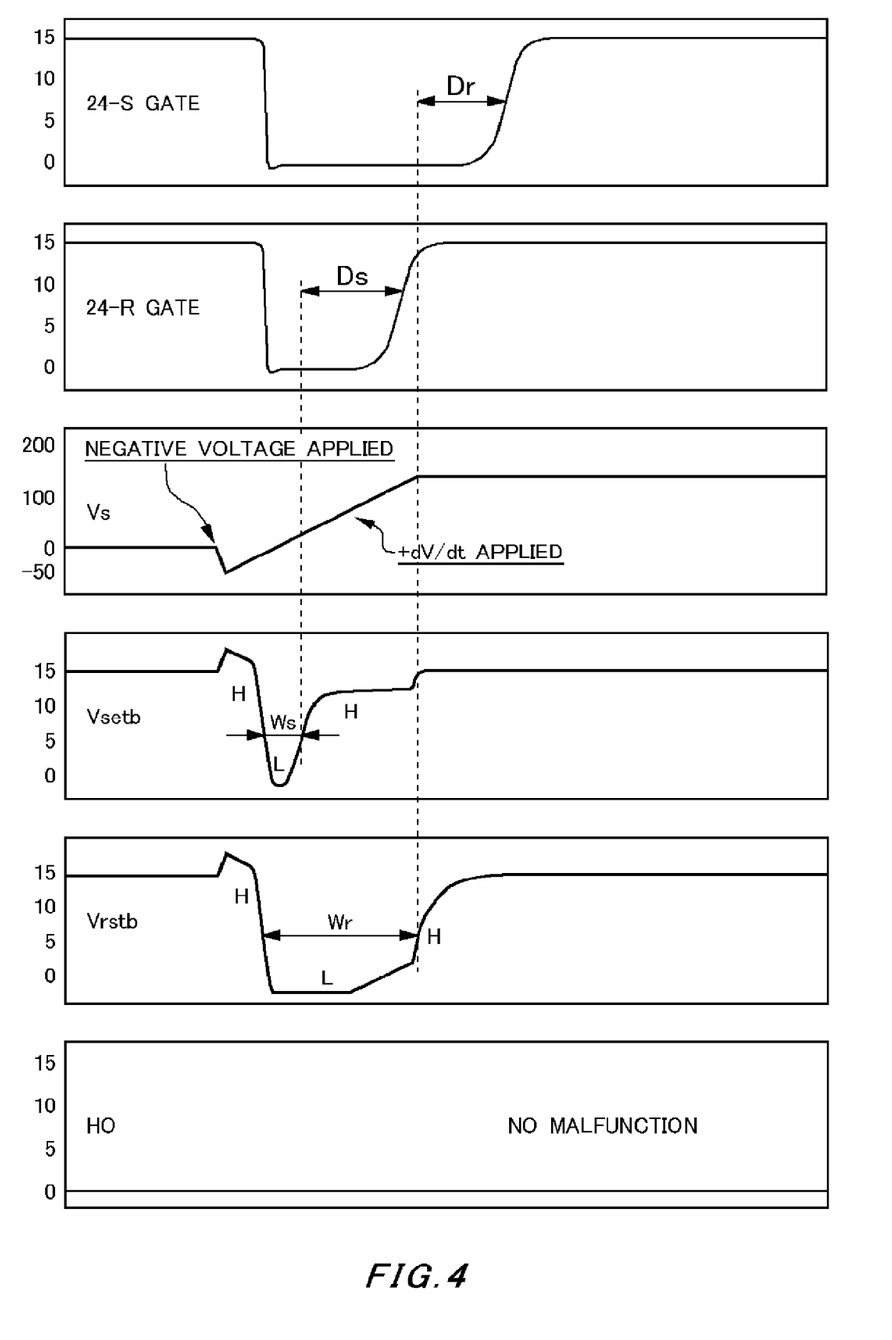
FIG. 4 is a diagram showing an operation example of the driving circuit 100.

FIG. 4 is a diagram showing an operation example of the driving circuit 100. In FIG. 4, time waveforms are shown regarding a gate voltage of a set side second MOS transistor 24-S, a gate voltage of a reset side second MOS transistor 24-R, a high-side reference potential Vs, a set potential Vsetb, a reset potential Vrstb, and a control signal HO which a high-side driver unit 46 outputs. In FIG. 4, the vertical axis shows a voltage [V]. Note that voltages other than the high-side reference potential Vs show voltage values with respect to the high-side reference potential Vs. That is, 0V of the vertical axis in voltage waveforms other than the high-side reference potential Vs correspond to the high-side reference potential Vs.

In the example of FIG. 4, the case in which a surge voltage is applied to a high-side reference potential Vs in the state that a high-side driver unit 46 outputs an L logic control signal HO is shown. The surge voltage is similar to the example of FIG. 2.

Similar to the example of FIG. 2, when a negative voltage is applied to the high-side reference potential Vs, the set potential Vsetb and the reset potential Vrstb are temporarily higher potentials than the high-side reference potential Vs and the high potential Vb by an influence of not illustrated parasitic diodes of the negative voltage and the serial transistor units 20-S, 20-R. The difference of the high potential Vb and the high-side reference potential Vs of the present example (that is, a voltage which the high-side power source 230 generates) is 15V.

As described in FIG. 3, when a negative surge voltage is applied to the high-side reference potential Vs of the driving circuit 100, respective buffers 18 control corresponding second MOS transistors 24 to the OFF states. In the example of FIG. 4, because the second MOS transistors 24 are already the OFF states, respective buffers 18 maintain corresponding second MOS transistors 24 to the OFF states.

Next, when a dV/dt noise is applied to a high-side reference potential Vs, although a high potential Vb increases, the set potential Vsetb and the reset potential Vrstb cannot track a variation of a potential due to the charging/discharging operation toward parasitic capacitances 16-S, 16-R, and decrease relatively with respect to the high potential Vb. For this reason, respective buffers 18 control corresponding second MOS transistors 24 to the ON states. In this case, the set side first MOS transistor 22-S and the second MOS transistor 24-S are both controlled to the ON states. Accordingly, the set potential Vsetb is pulled up to the high potential Vb at high speed via these transistors.

On the other hand, the reset side first MOS transistor 22-R is the OFF state, a series resistance of the first MOS transistor 22-R and the second MOS transistor 24-R is large, the reset potential Vrstb is pulled up to the high potential Vb via the resistance 13-R which is connected in parallel. A resistance value of the resistance 13-R is sufficiently smaller than a combined resistance of each OFF resistance of the first MOS transistor 22 and the second MOS transistor 24. However, because the resistance value of the resistance 13-R is larger than an ON resistance of the set side first MOS transistor 22-S and the second MOS transistor 24-S which are connected in series, the reset potential Vrstb varies slowly compared to the set potential Vsetb.

In the present example, a period from falling below the threshold value of the set side buffer 18-S to exceeding the threshold value by the set potential Vsetb is a pulse width Ws of the set potential Vsetb. Also, a period from falling below the threshold value of the reset side buffer 18-R to exceeding the threshold value by the reset potential Vrstb is a pulse width Wr of the reset potential Vrstb.

As shown in FIG. 4, when the latch circuit 44 outputs the L logic (the high-side reference potential Vs), the pulse width Ws of the set potential Vsetb is sufficiently smaller than the pulse width Wr of the reset potential Vrstb. For this reason, it can be prevented that the set potential Vsetb is the L logic and the reset potential Vrstb is the H logic, which can prevent a malfunction of the high-side control circuit 40.

Also, the set side buffer 18-S maintains the corresponding second MOS transistor 24-R to the ON state for the period which is longer than the pulse width Ws of the set potential Vsetb by the maintaining period Ds. Also, the reset side buffer 18 maintains the corresponding second MOS transistor 24-S to the ON state for the period which is longer than the pulse width Wr of the reset potential Vrstb by the maintaining period Dr.

A maintaining period Ds in which the set side buffer 18-S keeps maintaining the second MOS transistor 24-R to the ON state after a pulse of a set potential Vsetb is finished and a maintaining period Dr in which the reset side buffer 18-R keeps maintaining the second MOS transistor 24-S to the ON state after a pulse of a reset potential Vrstb is finished may be equal.

In this manner, a malfunction of the high-side control circuit 40 can be prevented even when a dV/dt noise is applied over a long period of time by maintaining the second MOS transistors 24 to the OFF states by respective buffers 18. Note that the maintaining periods Ds and Dr in the set side buffer 18-S and the reset side buffer 18-R may be variable.

Figure 5:
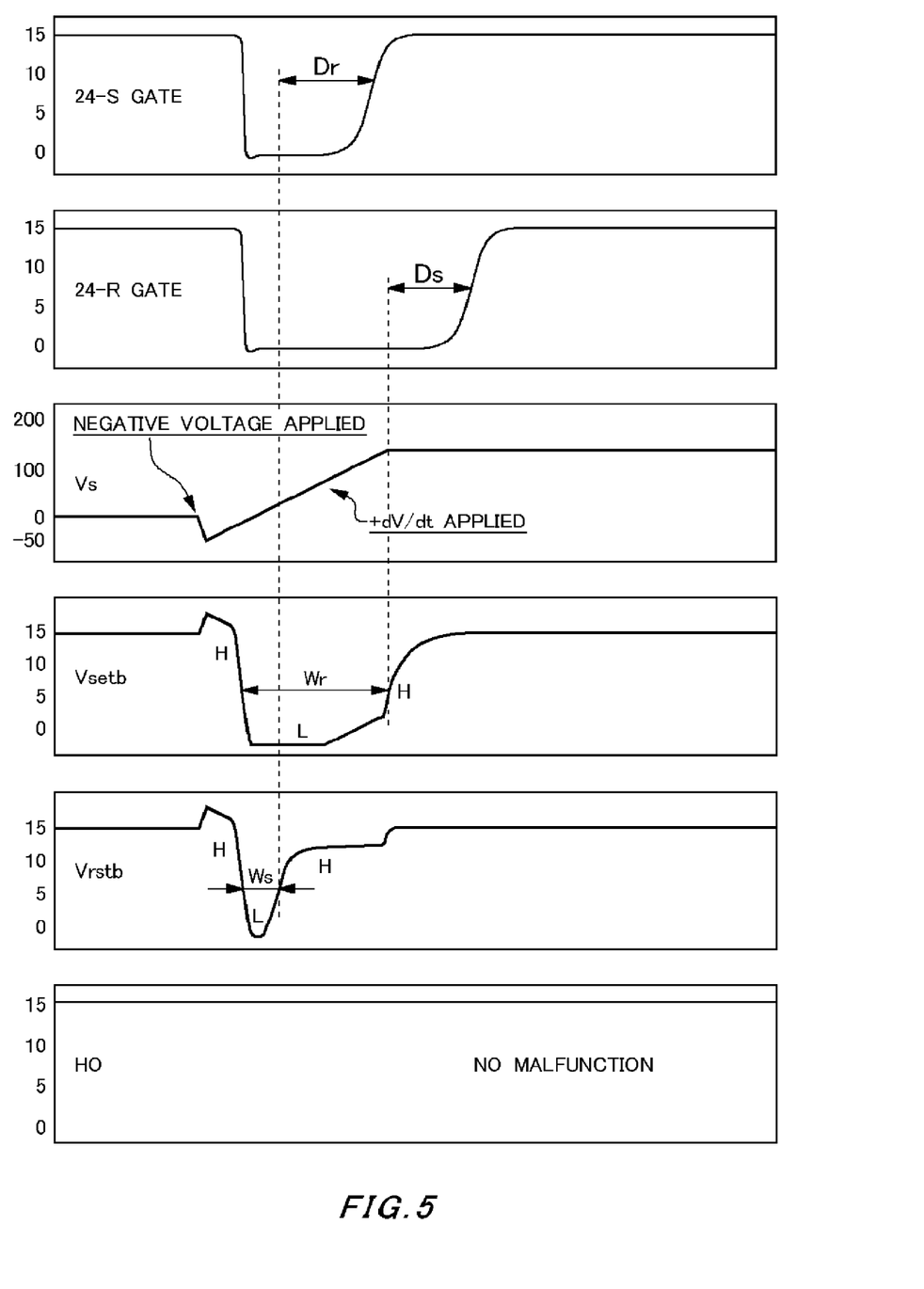
FIG. 5 is a diagram showing another operation example of the driving circuit 100.

FIG. 5 is a diagram showing another operation example of the driving circuit 100. In the example of FIG. 5, the case in which a surge voltage is applied to a high-side reference potential Vs in the state that a high-side driver unit 46 outputs an H logic control signal HO is shown. The surge voltage is similar to the example of FIG. 2.

In the present example, the set side first MOS transistor 22-S is controlled to the OFF state, and the reset side first MOS transistor 22-R is controlled to the ON state by the feedback unit 48. For this reason, the set potential Vsetb is the same as the reset potential Vrstb in the example of FIG. 4. Also, the reset potential Vrstb is the same as the set potential Vsetb in the example of FIG. 4.

Also, a gate voltage of the set side second MOS transistor 24-S is the same as a gate voltage of the reset side second MOS transistor 24-R in the example of FIG. 4. Also, a gate voltage of the reset side second MOS transistor 24-R is the same as a gate voltage of the set side second MOS transistor 24-S in the example of FIG. 4. In this manner, when the latch circuit 44 outputs the H logic, a malfunction of the high-side control circuit 40 can also be prevented.

Note that properties of the set side and reset side first MOS transistors 22 are preferably equal to each other. Also, properties of the set side and reset side second MOS transistors 24 are preferably equal to each other. Also, properties of the resistance 13-S and the resistance 13-R are preferably equal to each other. That is, each component of the set side level shift circuit 10-S and the reset side level shift circuit 10-R preferably has a property which is equal to each other. Thereby, a malfunction due to variations of elements can be decreased.

Figure 6:
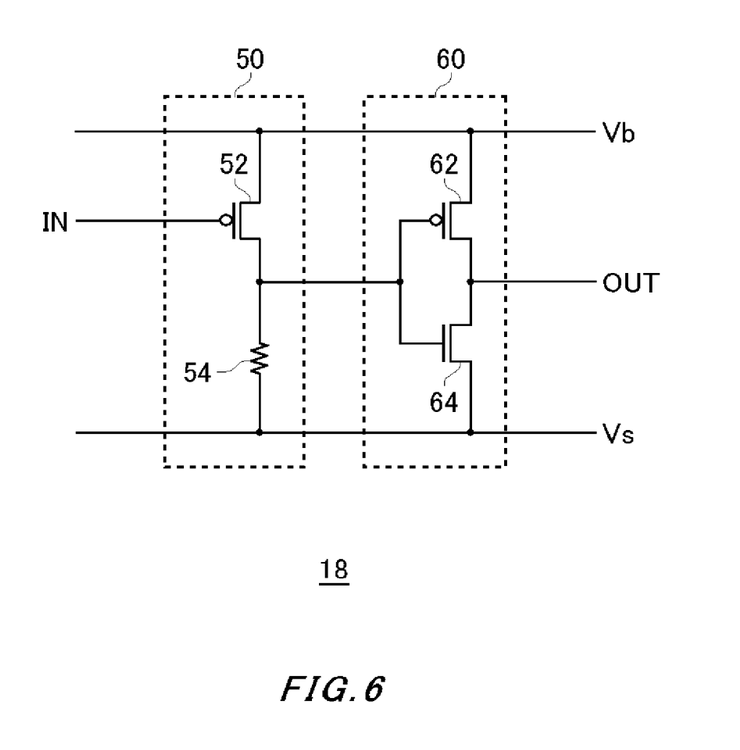
FIG. 6 is a diagram showing a configurational example of a buffer 18.

FIG. 6 is a diagram showing a configurational example of a buffer 18. The set side buffer 18-S and the reset side buffer 18-R may have the same configuration. The buffer 18 of the present example has a source-grounded amplification circuit 50 and an output unit 60.

The source-grounded amplification circuit 50 has a MOS transistor 52 with a source connected to the high potential Vb, and a resistance 54 which is connected between a drain of the MOS transistor 52 and the high-side reference potential Vs. The MOS transistor 52 of the present example is a PMOS transistor, and a set potential Vsetb or a reset potential Vrstb is inputted to a gate terminal of the MOS transistor 52.

The output unit 60 operates depending on a drain voltage of the MOS transistor 52. The output unit 60 of the present example is an inverter which operates depending on a drain voltage of the MOS transistor 52. The inverter has a PMOS transistor 62 and a NMOS transistor 64 which are connected in series.

In the buffer 18, an input potential IN relatively decreases due to a dV/dt noise, the MOS transistor 52 is the ON state, and the H logic (the high potential Vb) is inputted to the inverter. Accordingly, the L logic (the high-side reference potential Vs) is outputted from the inverter.

When the input potential IN is pulled up to the high potential Vb, the MOS transistor 52 is the OFF state, and the L logic is inputted to the inverter. Accordingly, the H logic is outputted from the inverter. However, after the MOS transistor 52 is set to an OFF state, because a transition time of a drain potential of the MOS transistor 52 is delayed due to an RC time constant circuit which is configured of a gate capacitance of the PMOS transistor 62 and the NMOS transistor 64 and a pull down resistance 54, the output of the inverter does not transit to an H logic for a certain time.

This RC time constant can be adjusted by a resistance 54. By adjusting a resistance value of the resistance 54, the maintaining periods Ds and Dr shown in FIG. 4 and FIG. 5 can be set appropriately. The maintaining periods Ds and Dr may be about 0.1 µs to 1 µs. A lower limit of the maintaining periods Ds and Dr may be about 0.2 µs, or may also be about 0.5 µs. Note that by making the resistance 54 a variable resistance, the maintaining periods Ds and Dr can be changed appropriately. The driving circuit 100 may set the maintaining periods Ds and Dr longer than at present when a malfunction occurs in the high-side control circuit 40.

Figure 7:
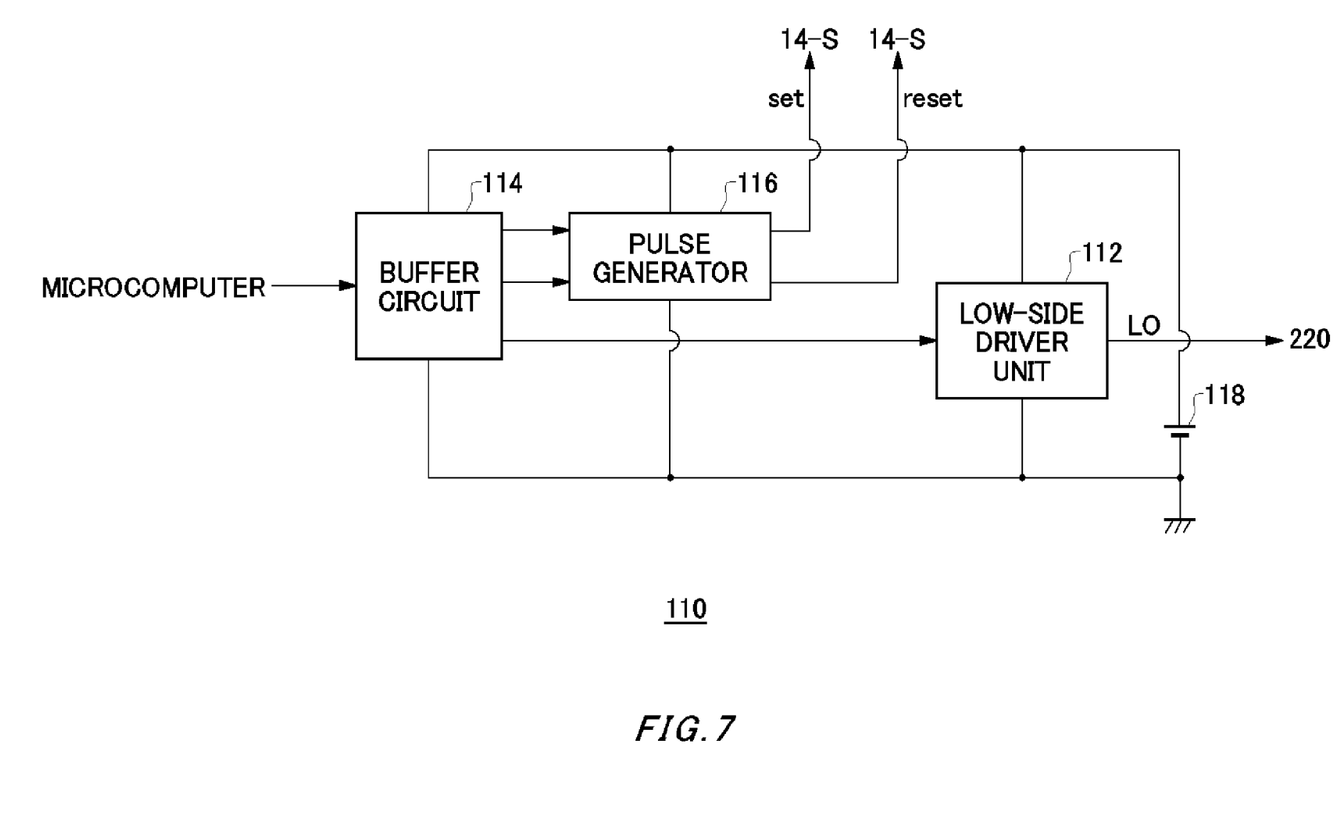
FIG. 7 is a diagram showing a configurational example of a low-side control circuit 110.

FIG. 7 is a diagram showing a configurational example of a low-side control circuit 110. The low-side control circuit 110 of the present example controls a low-side transistor 220, as well as generates a set signal SET and a reset signal RESET which are inputted to a input transistor 14-S and a input transistor 14-R.

The low-side control circuit 110 has a low-side driver unit 112, a buffer circuit 114, and a pulse generator 116. Also, the low-side control circuit 110 may have a power source 118, or may also be connected to the outside power source 118. The low-side control circuit 110 operates using a low-side high potential and a common reference potential as a power source potential. In the present example, the common reference potential is a ground potential. Also, the high potential is a potential in which a voltage of the power source 118 is added with respect to the common reference potential.

The buffer circuit 114 receives a signal which instructs whether to apply a high potential to a load 200, or apply a low potential from the outside microcomputer and the like. The buffer circuit 114 generates a set timing which shows a timing in which the high-side driver unit 46 outputs the H logic, and a reset timing which shows a timing in which the high-side driver unit 46 outputs the L logic based on the signal.

The pulse generator 116 generates a pulse-like set signal SET depending on the set timing. Also, the pulse generator 116 generates a pulse-like reset signal RESET depending on the reset timing.

Also, the buffer circuit 114 outputs a signal to control the low-side driver unit 112 based on the signal received from the microcomputer and the like. The low-side driver unit 112 outputs a control signal LO to control the transistor 220 based on the signal from the buffer circuit 114.

The driving circuit 100 may be formed by a single chip. Also, the low-side control circuit 110 may also be formed in a different chip from other circuit elements. Also, the low-side driver unit 112 may also be formed in a different chip from the buffer circuit 114 and the pulse generator 116.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . level shift circuit, 12 . . . diode, 13 . . . resistance, 14 . . . input transistor, 16 . . . parasitic capacitance, 18 . . . buffer, 20 . . . serial transistor unit, 22 . . . first MOS transistor, 24 . . . second MOS transistor, 40 . . . high-side control circuit, 42 . . . protection circuit, 44 . . . latch circuit, 46 . . . high-side driver unit, 48 . . . feedback unit, 49 . . . inverter, 50 . . . source-grounded amplification circuit, 52 . . . MOS transistor, 54 . . . resistance, 60 . . . output unit, 62 . . . PMOS transistor, 64 . . . NMOS transistor, 100 . . . driving circuit, 110 . . . low-side control circuit, 112 . . . low-side driver unit, 114 . . . buffer circuit, 116 . . . pulse generator, 118 . . . power source, 200 . . . load, 210 . . . transistor, 220 . . . transistor, 230 . . . power source, 240 . . . power source

What is claimed is:

1. A driving circuit which drives a subsequent stage circuit depending on a set signal and a reset signal that are inputted, comprising:
a set side level shift circuit which operates depending on the set signal, and generates a set potential,
a reset side level shift circuit which operates depending on the reset signal, and generates a reset potential, and
a control circuit which generates a control signal depending on the set potential and the reset potential, and drives the subsequent stage circuit, wherein
each of the set side level shift circuit and the reset side level shift circuit has
an input transistor which is provided between a high potential and a reference potential, operates depending on the set signal or the reset signal, and outputs a drain potential as the set potential or the reset potential, and
a serial transistor unit which includes a first MOS transistor and a second MOS transistor which are connected in series between a drain terminal of the input transistor and the high potential,
the first MOS transistors in the set side level shift circuit and the reset side level shift circuit complementarily operate to each other corresponding to a logical value of the control signal which the control circuit outputs,
the set side level shift circuit further has a set side buffer which compares a level of the set potential with a threshold value of the set side buffer depending on the high potential, and controls the second MOS transistor of the reset side level shift circuit based on a result of the comparison of the level of the set potential with the threshold value of the set side buffer,
the reset side level shift circuit further has a reset side buffer which compares a level of the reset potential with a threshold value of the reset side buffer depending on the high potential, and controls the second MOS transistor of the set side level shift circuit based on a result of the comparison of the level of the reset potential with the threshold value of the reset side buffer.

2. The driving circuit according to claim 1, wherein when a negative surge voltage is applied to a high-side reference potential, the set side buffer and the reset side buffer controls the corresponding second MOS transistors to OFF states.

3. The driving circuit according to claim 2, wherein when a positive surge voltage is applied to the high-side reference potential, the set side buffer and the reset side buffer controls the corresponding second MOS transistors to ON states.

4. The driving circuit according to claim 3, wherein the set side buffer maintains the corresponding second MOS transistor to an ON state during a longer period than a pulse width of the set potential,
the reset side buffer maintains the corresponding second MOS transistor to an ON state during a longer period than a pulse width of the reset potential.

5. The driving circuit according to claim 4, wherein a maintaining period in which the set side buffer keeps maintaining the corresponding second MOS transistor to an ON state after a pulse of the set potential is finished and a maintaining period in which the reset side buffer keeps maintaining the corresponding second MOS transistor to an ON state after a pulse of the reset potential is finished are equal.

6. The driving circuit according to claim 4, wherein periods in which the set side buffer and the reset side buffer maintain the corresponding second MOS transistors to ON states are variable.

7. The driving circuit according to claim 1, wherein each of the set side level shift circuit and the reset side level shift circuit further has a resistor provided parallel to the serial transistor unit between the high potential and the reference potential.

8. The driving circuit according to claim 1, wherein properties of the respective first MOS transistors in the set side level shift circuit and the reset side level shift circuit are equal, and
properties of the respective second MOS transistors in the set side level shift circuit and the reset side level shift circuit are equal.

9. The driving circuit according to claim 1, wherein
each of the set side buffer and the reset side buffer has
 a MOS transistor including a source connected to the high potential,
 a resistor which is connected to a drain of the MOS transistor, and
 an output unit which operates depending on a drain voltage of the MOS transistor.

10. The driving circuit according to claim 9, wherein
the output unit has an inverter which operates depending on the drain voltage of the MOS transistor.

11. The driving circuit according to claim 1, wherein
the control circuit has
a latch circuit which outputs the control signal depending on the set potential and the reset potential which are inputted, and
a driver unit which drives the subsequent stage circuit depending on the control signal,
the driving circuit further comprises a feedback unit which makes the first MOS transistors of the set side level shift circuit and the reset side level shift circuit complementarily operate based on the control signal.

12. The driving circuit according to claim 11, wherein
the feedback unit controls the first MOS transistor of the set side level shift circuit to an ON state when the control signal is a Lo logic, and controls the first MOS transistor of the reset side level shift circuit to an OFF state when the control signal is a Hi logic.

13. The driving circuit according to claim 1, wherein
the subsequent stage circuit is made of a circuit in which two transistors are connected in series, and a high-side reference potential is a potential of a connection point of the two transistors.

* * * * *